(12) United States Patent
Thackston

(10) Patent No.: US 9,570,861 B2
(45) Date of Patent: Feb. 14, 2017

(54) ELECTRICAL CONNECTOR HAVING FLEXIBLE PRINTED CIRCUIT BOARD TERMINATION

(71) Applicant: Tyco Electronics Corporation, Berwyn, PA (US)

(72) Inventor: Kevin Michael Thackston, York, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 53 days.

(21) Appl. No.: 14/737,037

(22) Filed: Jun. 11, 2015

(65) Prior Publication Data

US 2016/0365678 A1 Dec. 15, 2016

(51) Int. Cl.
*H01R 12/00* (2006.01)
*H01R 13/66* (2006.01)
*H01R 4/02* (2006.01)

(52) U.S. Cl.
CPC ............ *H01R 13/665* (2013.01); *H01R 4/02* (2013.01)

(58) Field of Classification Search
CPC ....... H01R 12/62; H01R 12/79; H01R 12/592; H01R 12/774; H05K 3/365; H05K 3/361
USPC .......................... 439/67, 492, 493, 660, 262
See application file for complete search history.

(56) References Cited

U.S. PATENT DOCUMENTS

| 4,691,972 | A | * | 9/1987 | Gordon | H05K 3/365 361/749 |
| 4,913,656 | A | * | 4/1990 | Gordon | H05K 3/365 439/493 |
| 5,726,432 | A | * | 3/1998 | Reichardt | G06K 7/0021 235/441 |
| 8,425,236 | B2 | * | 4/2013 | Cipolla | H01R 12/716 439/59 |
| 2005/0239300 | A1 | | 10/2005 | Yasumura et al. | |

OTHER PUBLICATIONS

International Searcj Report, International Application No. PCT/US2016/035476, International Filing Date, Jun. 2, 2016.

* cited by examiner

*Primary Examiner* — Hien Vu

(57) ABSTRACT

An electrical connector includes a housing having a cavity and a wafer stack received in the cavity. The wafer stack includes a plurality of electrical wafers arranged parallel to each other within the cavity. Each wafer includes a dielectric body and a leadframe having plural conductors held in the dielectric body, the conductors having terminating contacts and mating contacts with leads therebetween. The terminating contacts are both horizontally staged and vertically staged and exposed in a pocket of the dielectric body for electrical termination. The mating contacts being exposed for electrical connection. The electrical connector includes a flex harness includes a plurality of FPCBs. The FPCBs are electrically connected to corresponding wafers. Each FPCB has a stepped mating interface with conductors along the stepped mating interface configured to be electrically connected to corresponding terminating contacts.

19 Claims, 5 Drawing Sheets

ELECTRICAL CONNECTOR HAVING FLEXIBLE PRINTED CIRCUIT BOARD TERMINATION

BACKGROUND OF THE INVENTION

The subject matter herein relates generally to electrical connectors having flexible printed circuit board termination, such as to wafers.

Modern electronic systems such as telecommunications systems and computer systems often include large circuit boards called backplane boards which are rack mounted or retained in cabinets and are electrically connected to a number of smaller circuit boards called daughter cards. Electrical connectors establish communications between the backplane and the daughter cards. The daughter cards are typically separate from each other and meet different requirements for different purposes such as transmission of high speed signals, low speed signals, power, etc. that are transferred to the daughter cards from the backplane board. Cable connectors are typically electrically connected to various electrical connectors within the system. However, as the density of such systems increase, the number of cables increases. The cables add weight to the system and occupy a large amount of space. In some applications, such as military and aerospace applications, weight reduction and space reduction are important. In some applications, environmental sealing of connectors is important.

Some systems use flexible printed circuit boards (FPCBs) or ribbon cables rather than cables. However, termination of the flexible printed circuit boards is difficult. Additionally, while the traces may be tightly packaged within the flexible printed circuit board, such as on multiple layers, at the terminating interface, the traces are fanned outward to provide space for all of the traces/pads at a common edge. The flexible printed circuit board has a large size at such interface.

A need exists for a connector system that is cost effective and reliable that may provide a weight reduction and/or a space reduction.

BRIEF DESCRIPTION OF THE INVENTION

In one embodiment, an electrical connector is provided including a housing having a cavity and a wafer stack received in the cavity. The wafer stack includes a plurality of electrical wafers arranged parallel to each other within the cavity. Each wafer includes a dielectric body and a leadframe having plural conductors held in the dielectric body, the conductors having terminating contacts and mating contacts with leads therebetween. The terminating contacts are both horizontally staged and vertically staged and exposed in a pocket of the dielectric body for electrical termination. The mating contacts being exposed for electrical connection. The electrical connector includes a flex harness includes a plurality of FPCBs. The FPCBs are electrically connected to corresponding wafers. Each FPCB has a stepped mating interface with conductors along the stepped mating interface configured to be electrically connected to corresponding terminating contacts.

In another embodiment, an electrical connector is provided including a housing having a cavity and a wafer stack received in the cavity. The wafer stack includes a plurality of electrical wafers arranged parallel to each other within the cavity, each wafer including a dielectric body and a leadframe having plural conductors held in the dielectric body. The dielectric body has a pocket formed in a mating side of the wafer having a plurality of steps. The conductors have terminating contacts and mating contacts with leads therebetween. The terminating contacts are arranged along each of the steps and exposed along the corresponding steps for electrical termination. The mating contacts are exposed for electrical connection. The electrical connector includes a flex harness having a plurality of FPCBs. The FPCBs are electrically connected to corresponding wafers. Each FPCB has a stepped mating interface with conductors along the stepped mating interface configured to be electrically connected to corresponding terminating contacts.

DETAILED DESCRIPTION OF THE INVENTION

Figure 1:
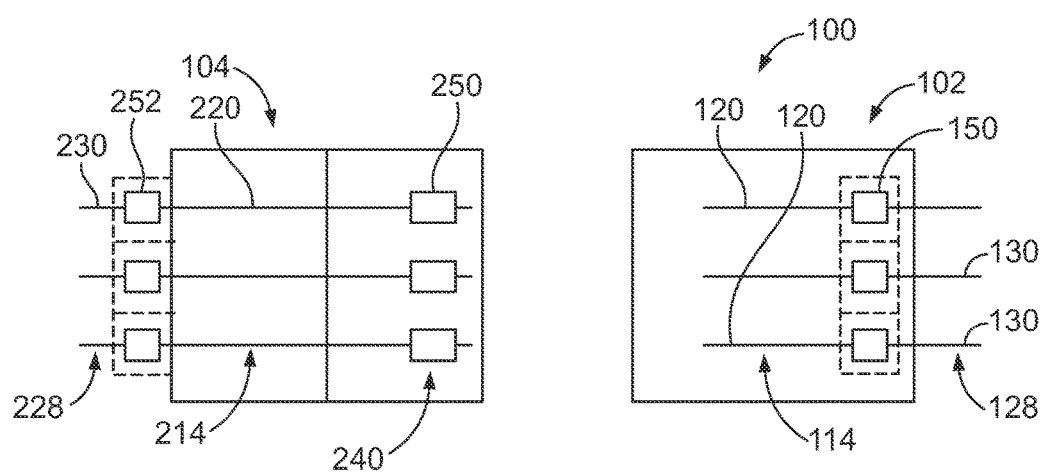
FIG. 1 is a schematic illustration of a connector system formed in accordance with an exemplary embodiment.

FIG. 1 is a schematic illustration of a connector system 100 formed in accordance with an exemplary embodiment. The connector system 100 includes a first electrical connector 102 and a second electrical connector 104 configured to be electrically connected to the first electrical connector 102. In an exemplary embodiment, the electrical connectors 102, 104 are high-speed and high density electrical connectors. The electrical connectors 102, 104 may be used as part of a computer system or a communication system, such as a backplane system. The electrical connectors 102, 104 may be electrically connected to a backplane circuit board, a daughtercard circuit board, a switch card, a line card or another electronic device. In an exemplary embodiment, the connector system 100 is part of a flexible communication system where various components may be interconnected by flexible printed circuit boards (FPCBs). For example, in the illustrated embodiment, both the first and second electrical connectors 102, 104 are terminated to ends of FPCBs. In other various embodiments, one or more of the electrical connectors 102, 104 may be mounted to a circuit board. In other various embodiments, one or more of the electrical connectors 102, 104 may be terminated to ends of cables.

The FPCBs allow flexibility in the design and system layout. The electrical connectors 102, 104 establish communication between the various components. The connector system 100 may be designed to meet different requirements for different purposes such as transmission of high speed signals, low speed signals, power, and the like between the various components. Because connector space may be limited on circuit boards, the FPCBs allow electrical connection without the need for one or more circuit boards. For example, midplane boards, daughtercards and/or backplanes may be eliminated in the communication system with the use of the FPCBs.

The electrical connectors 102, 104 offer flexibility and customization within the connector system 100 by using modular components which can be used in a variety of combinations. For example, the electrical connectors 102, 104 use the FPCBs to route between various components or connectors. One or both of the electrical connectors 102, 104 may use leadframed electrical wafers at mating interfaces thereof (in the illustrated embodiment, the first electrical connector 102 uses wafers at the mating interface with the second electrical connector 104, while the second electrical connector 104 uses contacts to mate to the wafers of the first electrical connector 102 at a separable interface; however the second electrical connector 104 has wafers at the mating interface with the FPCBs). The electrical connectors 102, 104 provide a flexible platform to provide the density, data throughput, and signal integrity required for various applications in computer, communications, military, medical, industrial control or other industries. The use of the leadframed electrical wafers allows for cost effective sequencing and electrical customization of the connectors 102, 104. The leadframed electrical wafers provide an efficient interface for termination of the FPCBs. For example, as described in further detail below, the leadframed electrical wafer has a stepped interface for terminating a stepped end of the corresponding FPCB, such as for direct soldering thereto.

The wafers can be manufactured specifically for differential or single ended performance and the impedance, propagation delay, and crosstalk of the connector can be altered per customer requirements. The electrical connectors 102, 104 are scalable and may include any number of wafers, such wafers may be signal wafers, power wafers or signal and power wafers. The wafers are not necessarily all of the same type; and further, each can be functionally independent of the others. That is, the connectors 102, 104 can include a mix of electrical wafers that perform different functions. Layouts of the leads of the leadframed electrical wafer can be easily changed by stamping and forming various different leadframes. The connectors 102, 104 can be customized to a particular need simply by loading the appropriate wafers in a particular slot or location in the connector 102, 104. For instance, in an exemplary embodiment, the connectors 102, 104 may be configured to carry signal information on some wafers and also transfer power on other wafers. Further, in various embodiments, the signal wafers may be high density signal wafers, low density signal wafers and/or hybrid signal wafers configured to carry both high speed signals and low speed signals. In addition, the signal wafers may carry different numbers of signal lines.

In an exemplary embodiment, the electrical connector 102 includes a wafer stack 114 having a plurality of electrical wafers 120 arranged parallel to each other. Each wafer 120 includes conductors, such as traces or leads, extending between a first edge and a second edge (and optionally a third edge or more edges). The conductors may be stamped and formed. The conductors may include pads at or near the first and second edges for electrical terminations to the conductors. The conductors may include other mating interfaces, such as spring beams, split beams, pins, sockets, tuning forks, or other interfaces. Optionally, the edges may be at opposite sides from each other and thus define a straight pass through the wafer 120 of the power or signal. Alternatively, the edges may be perpendicular to each other.

The electrical connector 102 includes a flex harness 128 including a plurality of FPCBs 130. The FPCBs 130 are electrically connected to corresponding wafers 120 at mating interfaces 150. The FPCBs 130 may include traces, such as signal traces, ground traces, power traces and the like. Optionally, as in the illustrated embodiment, the FPCBs 130 may be soldered directly to the wafers 120 at the interfaces 150. For example, the traces of the FPCBs 130 are electrically connected to the pads of corresponding conductors of the wafers 120 of the wafer stack 114, such as at the second edge. Optionally, various layers of the FPCB 130 (e.g., signal layer, ground layer, power layer) may be exposed at the end of the FPCB 130 in a stepped arrangement. The stepped end of the FPCB 130 may be directly terminated to a corresponding stepped arrangement and stepped conductors of the wafer 120.

The electrical connector 104 includes a wafer stack 214 having a plurality of electrical wafers 220 arranged parallel to each other. Each wafer 220 includes conductors, such as traces or leads, extending between a first edge and a second edge (and optionally a third edge or more edges). The conductors may be stamped and formed. The conductors may include pads at or near the first and second edges for electrical terminations to the conductors. The conductors may include other mating interfaces, such as spring beams, split beams, pins, sockets, tuning forks, or other interfaces. Optionally, the edges may be at opposite sides from each other and thus define a straight pass through the wafer 220 of the power or signal. Alternatively, the edges may be perpendicular to each other.

The electrical connector 104 includes at least one contact sub-assembly 240 terminated to the wafer stack 214. In the illustrated embodiment, a single contact sub-assembly 240 is terminated to the wafer stack 214 as a unit; however, in alternative embodiments, individual contact sub-assemblies 240 may be separately terminated to each corresponding wafer 220. In an exemplary embodiment, the contact sub-assembly 240 includes a rigid printed circuit board (RPCB) and contacts extending from the RPCB. Housings may be mounted to both sides of the RPCB to hold the contacts. The contact sub-assembly 240 is terminated to the wafer stack 214 such that the contacts are terminated to corresponding traces of the wafers 220 at mating interfaces 250. Optionally, one or more of the edges of each of the wafers 220 may define separable interfaces with the contacts of the contact sub-assembly 240. The wafers 120 may extend from the housing of the contact sub-assembly 240. The contact sub-assembly 240 may include mating contacts defining a mating interface with the first electrical connector 102, such as to the wafers 120.

The electrical connector 104 includes a flex harness 228 having a plurality of FPCBs 230. The wafers 220 are provided between the contact sub-assembly 240 and the flex harness 228 and provide the electrical connection therebetween. Each FPCB 230 may be separately terminated to the wafer 220 at corresponding mating interfaces 252. The FPCBs 230 may include traces, such as signal traces, ground traces, power traces and the like. Optionally, as in the illustrated embodiment, the FPCBs 230 may be soldered directly to the wafers 220 at the interfaces 252. For example, the traces of the FPCBs 230 are electrically connected to the pads of corresponding conductors of the wafers 220 of the wafer stack 214, such as at the second edge. Optionally, various layers of the FPCB 230 (e.g., signal layer, ground layer, power layer) may be exposed at the end of the FPCB 230 in a stepped arrangement. The stepped end of the FPCB 230 may be directly terminated to a corresponding stepped arrangement and stepped conductors of the wafer 220.

Figure 2:
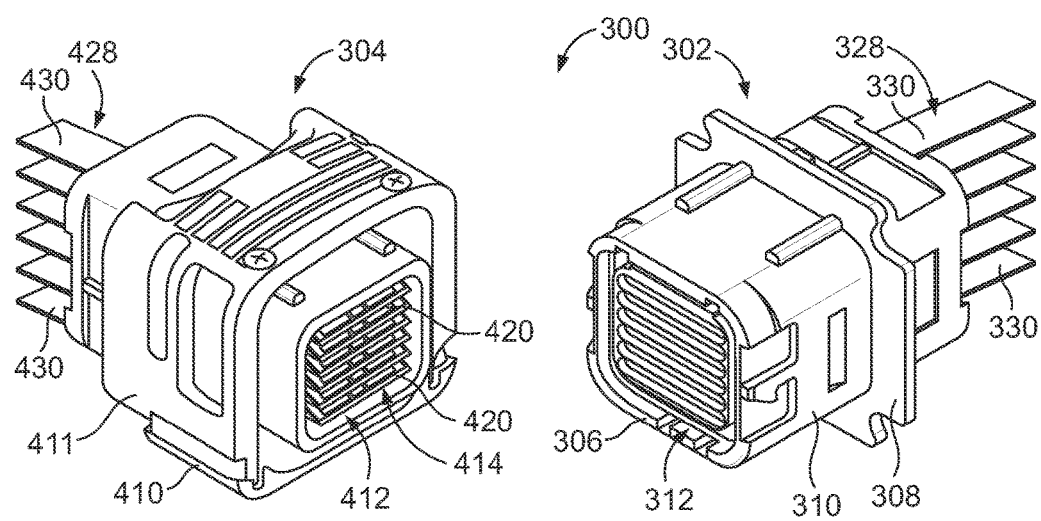
FIG. 2 illustrates a connector system formed in accordance with an exemplary embodiment.

FIG. 2 illustrates a connector system 300 formed in accordance with an exemplary embodiment. The connector system 300 includes a first electrical connector 302 and a second electrical connector 304 configured to be electrically connected to the first electrical connector 302. In an exemplary embodiment, the electrical connectors 302, 304 are modular rectangular connectors for use in aerospace or military applications and may have size, shape and mating interface requirements corresponding to the European standardized EN4165 connectors. For example, the electrical connectors 302, 304 may have features similar to DMC-M connectors designed and developed by TE Connectivity. Other types of electrical connectors may be provided in alternative embodiments.

Figure 3:
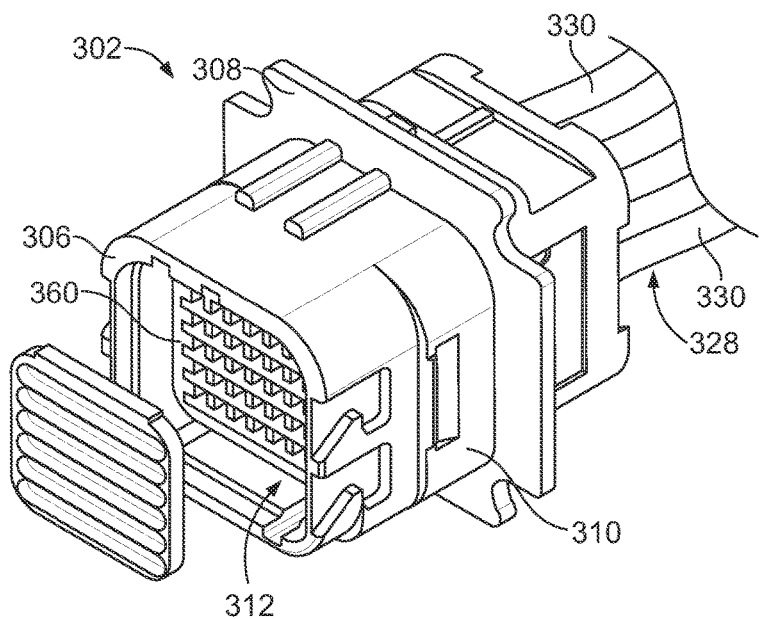
FIG. 3 is a front perspective view of an electrical connector in accordance with an exemplary embodiment.
Figure 4:
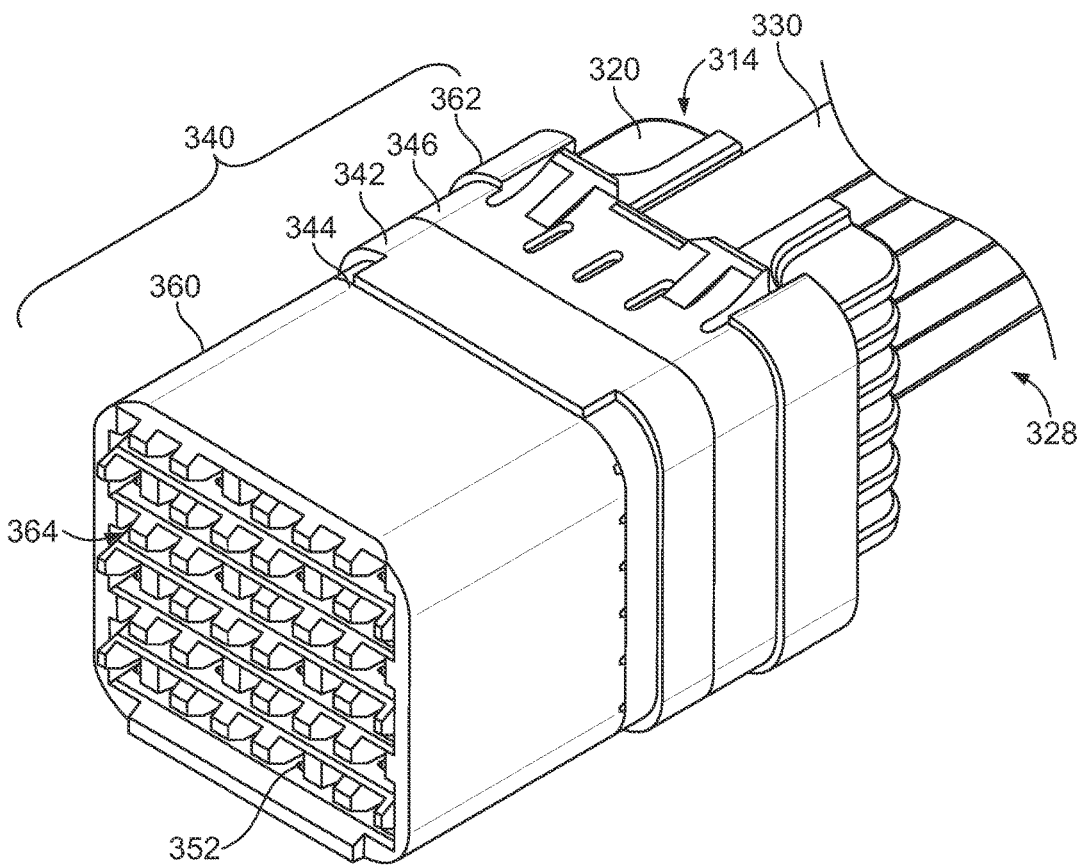
FIG. 4 is a front perspective view of a portion of the electrical connector shown in FIG. 3.

FIG. 2 shows the first electrical connector 302 poised for mating with the second electrical connector 304. FIG. 3 is a front perspective view of the electrical connector 302. FIG. 4 is a front perspective view of a portion of the electrical connector 302. In an exemplary embodiment, the electrical connector 302 includes a shell or housing 310 having a cavity 312. The housing 310 has a mating end 306 and a flange 308 for mounting the housing 310 in a device, panel or other structure. The electrical connector 302 is shown without the housing 310 in FIG. 4. In an exemplary embodiment, the housing 310 is conductive and provides electrical shielding for the components therein. The housing 310 may be a die cast housing. The housing 310 may be a plated plastic housing.

The electrical connector 302 includes a wafer assembly 314, which is received in the cavity 312. The wafer assembly 314 includes a plurality of electrical wafers 320 stacked together and arranged parallel to each other within the cavity 312. Optionally, the wafers 320 may be sealed at the housing 310, such as at the rear of the housing 310 with a seal or gasket received in the cavity 312 or with potting or another compound in the cavity 312. Each wafer 320 includes a leadframe 321 having a plurality of conductors 322 held within a dielectric body 323 of the wafer 320. The dielectric body 323 may be an overmolded dielectric body 323 overmolded over the leadframe 321. Alternatively, the dielectric body 323 may include body halves mated together, such as a clam shell body, which may be hinged. The leadframe 321 may be a stamped and formed leadframe. The conductors 322 of the leadframe 321 extend between opposite edges of the wafer 320 (for example, front and rear edges of the wafer 320). The conductors 322 may include pads 324 at or near the first and/or second edges for electrical terminations to the conductors 322. The conductors 322 may include other mating interfaces other than pads in alternative embodiments.

Figure 5:
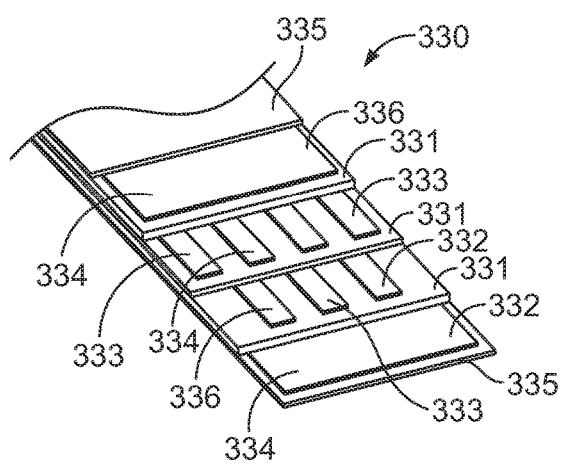
FIG. 5 illustrates an exemplary flexible printed circuit board (FPCB) of the electrical connector in accordance with an exemplary embodiment.

The electrical connector 302 includes a flex harness 328 including a plurality of FPCBs 330. The FPCBs 330 are electrically connected to corresponding wafers 320. Optionally, flex seals may be provided at the connection of the FPCBs 330 to the wafers 320 to provide sealing and/or strain relief. FIG. 5 illustrates an exemplary FPCB 330. The FPCB 330 may be a multi-layer FPCB including a plurality of layers 331. The layers 331 may be dedicated layers, having conductors 332 dedicated as signal conductors, ground conductors, power conductors and the like. Alternatively, the layers 331 may have more than one type of conductor 332, such as both signal and ground conductors on the same layer 331. In the illustrated embodiment, the FPCB 330 includes both signal conductors 333 and ground conductors 334. The FPCB 330 includes cover layers 335 on the outer sides of the FPCB 330. The conductors 332 have pads 336 for terminating to the wafer 320 (FIG. 6).

In an exemplary embodiment, the layers 331 are exposed for termination to the corresponding wafer 320. For example, the FPCB 330 may be laser ablated to expose various layers 331, such as in a stepped arrangement. Exposing the various layers may create a stepped FPCB 330 at the terminating end. Each step exposes different conductors 332. The conductors 332 are thus arranged and offset at different vertical heights (e.g., stepped vertically). As such, the conductors 332 are non-coplanar; however, the conductors 332 on one layer 331 are in a common plane (e.g., coplanar within the layer 331) and the conductors 332 in another layer 331 are in a parallel plane that is non-coplanar with the other layers 331. The conductors 332 are also arranged and offset at different horizontal positions (e.g., stepped longitudinally). As such, the conductors 332 are horizontally staged at different distances from a distal end or edge of the FPCB 330. Optionally, multiple conductors 332 are provided at each step and are offset at different horizontal positions (e.g., laterally offset).

Returning to FIGS. 2, 3 and 4, each FPCB 330 within the flex harness 328 is terminated to the corresponding wafer 320 in the wafer assembly 314. Optionally, the FPCB 330 may be sealed using one or more flex seals. During assembly, the FPCB 330 is configured to be terminated to the wafer 320. For example, the FPCB 330 may be soldered directly to the wafers 320. For example, the conductors 332 of the FPCB 330 are aligned with corresponding pads 324 of the wafer 220. Solder is provided between the conductors 322, 332 to electrically connect the FPCB 330 to the wafer 220. Optionally, because the FPCB 330 is stepped, the wafer 220, at the terminating end, may be stepped in a complementary manner to ensure that each of the conductors 322, 332 mate with each other.

Figure 6:
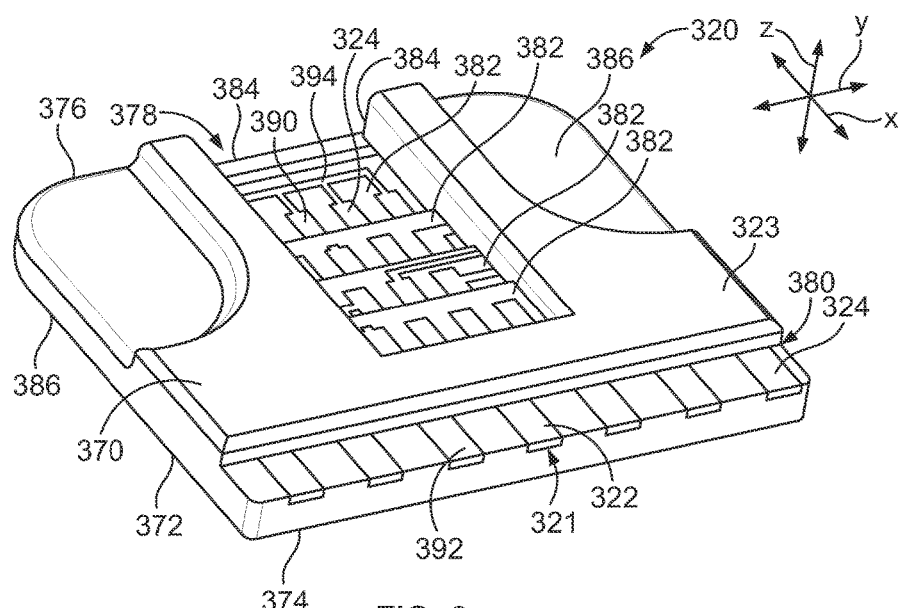
FIG. 6 is a perspective view of a wafer of the electrical connector formed in accordance with an exemplary embodiment including a leadframe and a dielectric body.
Figure 7:
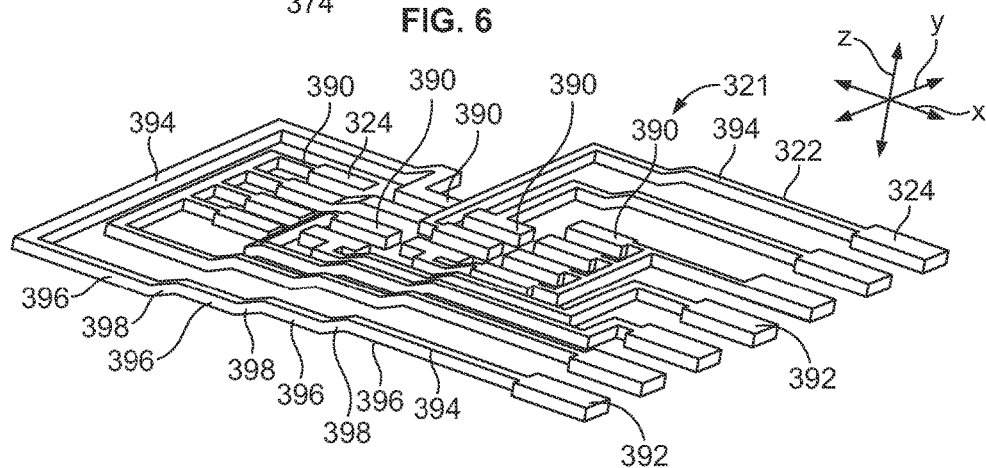
FIG. 7 is a perspective view of the leadframe without the dielectric body.
Figure 8:
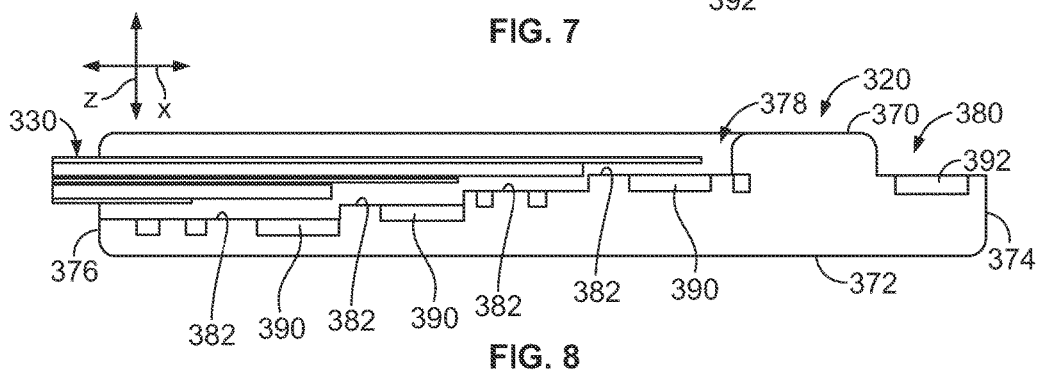
FIG. 8 is a cross-sectional view of the wafer with the FPCB terminated thereto.

FIG. 6 is a perspective view of the wafer 320 formed in accordance with an exemplary embodiment including the leadframe 321 and the dielectric body 323. FIG. 7 is a perspective view of the leadframe 321 without the dielectric body 323. FIG. 8 is a cross-sectional view of the wafer 320 with the FPCB 330 terminated thereto.

The dielectric body 323 includes a first side 370 (e.g., a top side) and a second side 372 (e.g., a bottom side) extending between a mating end 374 and a terminating end 376. The FPCB 330 is configured to be terminated to the wafer 320 at the terminating end 376. The mating end 374 is configured to be mated to another component, such as a contact subassembly or a mating connector.

In an exemplary embodiment, the dielectric body 323 includes a pocket 378 open at the first side 370 that receives the FPCB 330. The pocket 378 may be open at the terminating end 376 to allow the FPCB 330 to extend from the pocket 378 or to extend into the pocket 378. The pocket 378 may be used to polarize, position, and/or key the FPCB 330 relative to the dielectric body 323. The conductors 322 are exposed at the first side 370 in the pocket 378 for termination to the FPCB 330. The conductors 322 are exposed at the mating end 374. In the illustrated embodiment, the conductors 322 have pads 324 at the terminating end 376 and at the mating end 374. Optionally, the dielectric body 323 may have a recess 380 at the mating end 374 exposing the pads 324 of the conductors 322 at the mating end 374.

The pocket 378 is stepped and includes a plurality of steps 382. The steps 382 are stepped vertically between the first and second sides 370, 372. The steps 382 may rise vertically, such as in a Z direction defined between the first and second sides 370, 372, and the steps 382 may run horizontally, such as in an X direction defined between the mating end 374 and the terminating end 376. The X direction may be a longitudinal direction. The X direction may be the direction of the longitudinal axis of the FPCB 330. The steps 382 may also span horizontally across the dielectric body 323 in a Y direction.

The steps 382 are non-coplanar. The pocket 378 includes side walls 384 at opposite sides of the steps 382. The FPCB 330 is received in the pocket 378 between the side walls 384. Optionally, the FPCB 330 may be secured in the pocket 378 at the side walls 384, such as using adhesive or epoxy, which may provide strain relied between the FPCB 330 and the wafer 320. The FPCB 330 may be sealed in the pocket 378 at the side walls 384, such as using a sealant. The dielectric body 323 includes wings 386 on opposite sides of the pocket 378. Portions of the leadframe 321 may be contained within the wings 386.

With reference to FIG. 7, the leadframe 321 includes a plurality of the conductors 322. The conductors 322 include terminating contacts 390 and mating contacts 392 with leads 394 therebetween. The terminating contacts 390 are configured to be exposed in the pocket 378 of the dielectric body 323 for electrical termination to the FPCB 330. The mating contacts 392 are exposed at the mating ends 374 of the dielectric body 323, such as in the recess 380, for electrical termination. The leads 394 are routed between the terminating contacts 390 and the mating contacts 392, such as in the dielectric material of the dielectric body 323. For example, the leads 394 may be routed in the wings 386.

Optionally, the leads 394 may be encased in the dielectric material of the dielectric body 323. For example, in an exemplary embodiment, the dielectric body 323 is overmolded over the leadframe 321 such that the leads 394 are encased in the dielectric material of the dielectric body 323. Alternatively, the leads 394 may be received in pre-formed grooves in pre-molded dielectric body halves of the dielectric body 323 that are coupled together around the leadframe 321.

As noted above, the conductors 322 may be signal conductors, ground conductors, power conductors or other types of conductors. The pinout of the terminating contacts 390 may correspond to a pinout or layout of the conductors 332 of the FPCB 330 for electrical termination thereto. The pinout or layout of the mating contacts 392 may correspond to the layout of corresponding conductors or contacts of the contact subassembly or mating connector that the wafer 320 is connected to at the mating end 374. While the terminating contacts 390 are illustrated as pads 324, other types of terminating contacts may be provided in alternative embodiments for electrical connection to the conductors 332 of the FPCB 330. Similarly, while the mating contacts 392 are illustrated as pads 324, other types of mating contacts may be provided in alternative embodiments. For example, the mating contacts 392 may be spring beams, split beams, pins, sockets, tuning forks, or other interfaces, which may extend forward of the edge of the dielectric body 323 at the mating end 374 for mating to the contact subassembly or the mating connector.

The terminating contacts 390 are stepped to correspond with the steps 382 of the dielectric body 323. In an exemplary embodiment, the terminating contacts 390 are both horizontally staged and vertically staged for termination to the FPCB 330. For example, the terminating contacts 390 may be vertically staggered at various vertical stages (e.g., at different vertical heights or at different Z positions). Similarly, the terminating contacts 390 may be horizontally staggered at various horizontal stages or steps (e.g., longitudinally staggered at different X positions and/or laterally staggered at different Y positions). Optionally, multiple terminating contacts 390 are provided at each stage. Any number of terminating contacts 390 may be provided at each stage, and each stage may have a different number of terminating contacts 390.

Optionally, a plurality of the terminating contacts 390 may be electrically commoned and electrically connected to a common lead 394 and/or a common mating contact 392. For example, ground terminating contacts 390 may be electrically commoned. Optionally, the ground terminating contacts may be provided between certain signal terminating contacts or pairs of signal terminating contacts, such as to provide electrical isolation between the signal leads and/or pairs of signal leads.

The terminating contacts 390 are non-coplanar. For example, one or more of the terminating contacts 390 may be positioned at a first vertical height while one or more other terminating contacts 390 are positioned at a different, second vertical height above the second side 372. In the illustrated embodiment, the terminating contacts 390 are provided in four stages at four different vertical heights. Optionally, one of the stages may be coplanar with the mating contacts 392, such as along a mating plane (the mating plane contains the mating contacts 392). The other stages of terminating contacts 390 are vertically staged at various vertical heights below the mating plane of the mating contacts 392.

In an exemplary embodiment, the leads 394 transition vertically and/or horizontally between the terminating contacts 390 and the mating contacts 392. For example, the leads 394 include runner segments 396 extending horizontally and riser segments 398, extending, at least partially, vertically. For example, the riser segments 398 may be angled transversely and extend both horizontally and vertically. Alternatively, the riser segments 398 may be perpendicular to the runner segments 396. Optionally, the riser segments 398 may correspond with and be generally aligned with the steps 382.

With reference to FIG. 8, when the FPCB 330 is received in the pocket 378, the conductors 332 of the FPCB 330 are configured to be terminated to corresponding conductors 322 of the wafer 320. For example, the conductors 332 may be soldered to conductors 322. The stepped terminating end of the FPCB 330 fits in the stepped pocket 378. The layers 331 are aligned above corresponding steps 382 and corresponding terminating contacts 390 on such steps 382.

Figure 9:
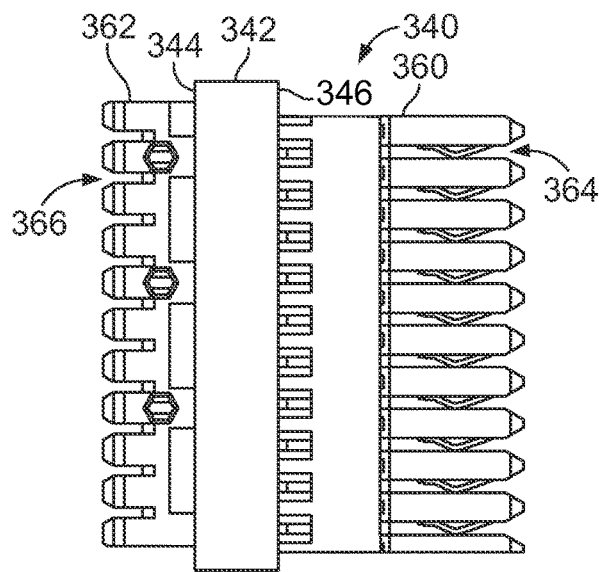
FIG. 9 illustrates an exemplary embodiment of a contact sub-assembly of the electrical connector in accordance with an exemplary embodiment.
Figure 10:
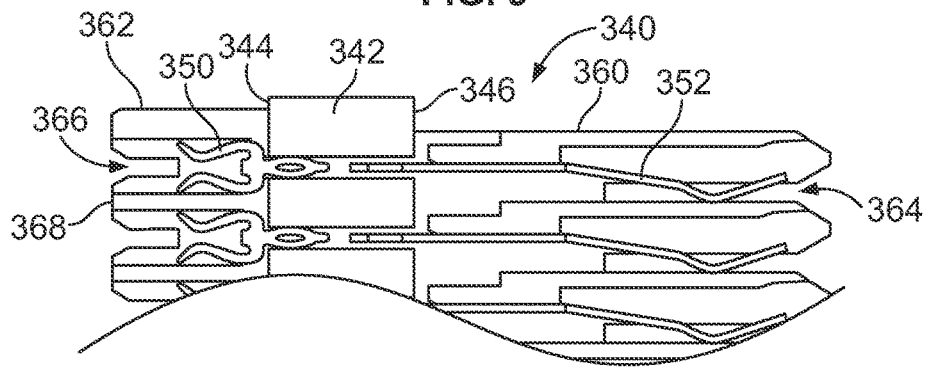
FIG. 10 is a cross-sectional view of a portion of the contact sub-assembly shown in FIG. 9.

Returning to FIG. 4, in an exemplary embodiment, the electrical connector 302 includes a contact sub-assembly 340 provided at the front of the wafer assembly 314. FIG. 9 illustrates an exemplary embodiment of the contact sub-assembly 340. FIG. 10 is a cross-sectional view of a portion of the contact sub-assembly 340. The contact sub-assembly 340 includes a RPCB 342 having a first side 344 and a second side 346. The RPCB 342 may include plated vias 348 therethrough. The contact sub-assembly 340 includes wafer contacts 350 received in corresponding vias 348 and extending from the first side 344 of the RPCB 342 and mating contacts 352 received in corresponding vias 348 and extending from the second side 346 of the RPCB 342. For example, the contacts 350, 352 may have compliant pins received in the vias 348.

Optionally, the wafer contacts 350 are tuning-fork style contacts including a socket configured to receive the wafer 320 therein. Other types of wafer contacts 350 may be provided in alternative embodiments. The wafer contacts 350 are configured to be terminated to the mating contacts 392 (shown in FIG. 6) of the wafers 320. The wafer contacts 350 may terminate to one or both sides of the wafer 320. The wafer contacts 350 may create a compression connection to the wafer 320. The wafer 320 may be connected to the contact sub-assembly 340 by an interference connection. The wafer contacts 350 may be soldered to the wafers 320 in some embodiments.

Optionally, the mating contacts 352 are spring beam style contacts having a deflectable spring beam configured to be mated with the electrical connector 304, such as to wafers of the electrical connector 304. The mating contacts 352 may define separable interfaces with the wafers of the electrical connector 304. The mating contacts 352 may be other types of contacts in alternative embodiments. The mating contacts 352 may be configured to be terminated to other components in alternative embodiments.

In an exemplary embodiment, the contact sub-assembly 340 includes a front housing 360 extending from the second side 346 of the RPCB 342 and a rear housing 362 extending from the first side 344 of the RPCB 342. The front housing 360 holds the mating contacts 352. For example, the front housing 360 may include a plurality of contact channels that hold corresponding mating contacts 352. The front housing 360 includes a plurality of slots 364 configured to receive wafers of the second electrical connector 304. The mating contacts 352 are configured to be electrically connected to the wafers received in the slots 364 at separable interfaces of the mating contacts 352. The rear housing 362 may define a wafer housing that holds the wafer contacts 350. The rear housing 362 has a plurality of slots 366 at a rear end 368. Each slot 366 is configured to receive a corresponding wafer 320 of the wafer assembly 314. The wafer contacts 350 may be terminated to such wafers 320 within the slots 366.

Figure 11:
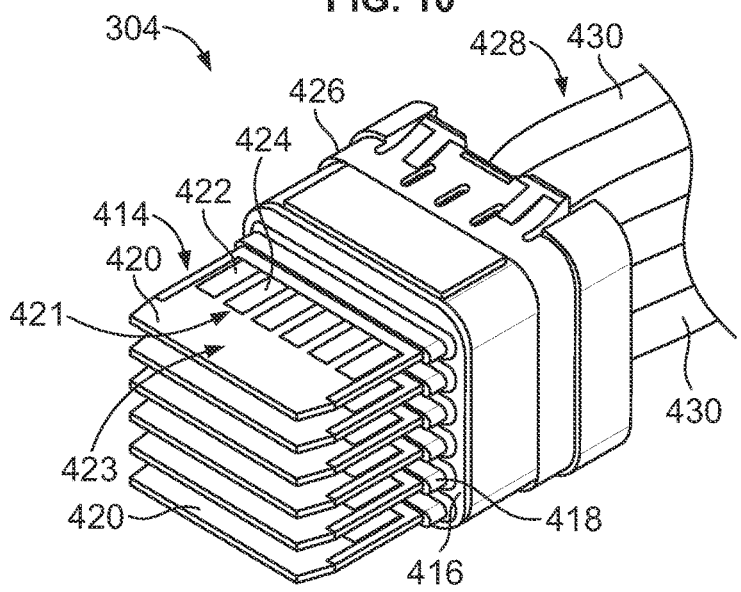
FIG. 11 illustrates a portion of an electrical connector of the connector system in accordance with an exemplary embodiment.

Returning to FIG. 2, and with additional reference to FIG. 11, which illustrates a portion of the electrical connector 304, the electrical connector 304 is configured to be mated with the electrical connector 302. The electrical connector 304 includes a housing 410 (FIG. 2) having a cavity 412. In an exemplary embodiment, the housing 410 is conductive and provides electrical shielding for the components therein. The housing 410 may be a die cast housing. A wafer assembly 414 is received in the cavity 412. The wafer assembly 414 includes a plurality of electrical wafers 420 stacked together and arranged parallel to each other within the cavity 412. Optionally, the electrical connector 304 may include a securing feature 411 for securing the electrical connector 304 to the electrical connector 302. The securing feature 411 may include a latch. The securing feature 411 may be slidably coupled to the housing 410 and may slide forward to latch or lock to the housing 310 of the electrical connector 302.

The wafers 420 may be similar to the wafers 320 (FIG. 6). For example, the wafers 420 may be leadframed wafers. In an exemplary embodiment, the wafers 420 may include a leadframe 421 and a dielectric body 423. The leadframe 421 may be a stamped and formed leadframe. The dielectric body 423 may be an overmolded dielectric body overmolded over the leadframe 421. Optionally, the wafers 420 may be sealed at the housing 410 and/or at the interface with the electrical connector 302.

Each wafer 420 includes conductors 422, such as signal conductors and/or ground conductors. The conductors 422 may include pads 424 for electrical termination, such as to the mating contacts 352 (FIG. 10) and/or to corresponding FPCB. The wafer 420 may include one or more ground layers which may be exposed at predetermined locations for electrical termination.

In an exemplary embodiment, the electrical connector 304 includes a wafer holder 426 (FIG. 11) configured to hold each of the wafers 420 of the wafer assembly 414. For example, the wafer holder 426 may hold the wafers 420 at predetermined spacing. The wafer holder 426 may have slots that hold the wafers 420. The wafer holder 426 is configured to be received in the housing 410. For example, the wafer holder 426 may be sized and shaped to fit in the cavity 412. The wafer holder 426 may be manufactured from a dielectric material, such as a plastic material.

The electrical connector 304 includes a flex harness 428 having a plurality of FPCBs 430. The FPCBs 430 may be similar to the FPCBs 330 (FIG. 6). The FPCBs 430 may be terminated to the wafers 420 in a similar manner as described above. For example, the FPCB 430 may be received in a stepped pocket of the wafer 420 and the conductors of the FPCB 430 may be soldered to corresponding conductors 422 of the wafers 420.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. An electrical connector comprising:
a housing having a cavity;
a wafer stack received in the cavity, the wafer stack comprising a plurality of electrical wafers arranged parallel to each other within the cavity, each wafer including a dielectric body and a leadframe having plural conductors held in the dielectric body, the conductors having terminating contacts and mating contacts with leads therebetween, the terminating contacts being both horizontally staged and vertically staged and exposed in a pocket of the dielectric body for electrical termination, the mating contacts being exposed for electrical connection; and a flex harness comprising a plurality of flexible printed circuit boards (FPCBs), the FPCBs being electrically connected to corresponding wafers, each FPCB having a stepped mating interface with conductors along the stepped mating interface configured to be electrically connected to corresponding terminating contacts;

wherein the pocket has a plurality of steps, the terminating contacts being arranged along corresponding steps and being exposed along the steps for electrical termination to be connected to corresponding conductors of the plurality of flexible printed circuit boards.

2. The electrical connector of claim 1, wherein the leadframe is a stamped and formed leadframe, the leads being stepped to vertically stagger the terminating contacts at various vertical stages.

3. The electrical connector of claim 1, wherein the terminating contacts are non-coplanar.

4. The electrical connector of claim 1, wherein the dielectric body includes a first side and a second side, the pocket being open at the first side, the terminating contacts being vertically offset at various vertical stages between the first and second sides, each vertical stage having plural terminating contacts thereon.

5. The electrical connector of claim 1, wherein the mating contacts are coplanar on a mating plane, the terminating contacts being vertically staged at various vertical stages below the mating plane.

6. The electrical connector of claim 1, wherein the conductors of the FPCB are soldered to the corresponding terminating contacts.

7. The electrical connector of claim 1, wherein the dielectric body is an overmolded dielectric body overmolded over the leadframe.

8. The electrical connector of claim 1, wherein the dielectric body includes a terminating zone at the pocket, the dielectric body including wings flanking the terminating zone, the leads being routed in the wings between the terminating contacts and the mating contacts.

9. The electrical connector of claim 1, wherein the terminating contacts are termination pads and the mating contacts are mating pads.

10. The electrical connector of claim 1, wherein the mating contacts are separable mating contacts extending forward of an edge of the dielectric body for electrical connection to corresponding mating contacts of a mating connector.

11. The electrical connector of claim 1, wherein the conductors comprise signal conductors and ground conductors.

12. The electrical connector of claim 1, wherein the FPCB comprises multiple layers including at least signal layer and at least one ground layer, each layer having corresponding conductors, the conductors of each layer being terminated to corresponding conductors of the wafer at different vertical stages.

13. The electrical connector of claim 1, wherein each of the leads have at least one runner segment extending horizontally and a majority of the leads have at least one riser segment extending, at least partially, vertically.

14. An electrical connector comprising:
a housing having a cavity;
a wafer stack received in the cavity, the wafer stack comprising a plurality of electrical wafers arranged parallel to each other within the cavity, each wafer including a dielectric body and a leadframe having plural conductors held in the dielectric body, the dielectric body having a pocket formed in a mating side of the wafer, the pocket having a plurality of steps, the conductors having terminating contacts and mating contacts with leads therebetween, the terminating contacts arranged along each of the steps and exposed along the corresponding steps for electrical termination to be connected to corresponding conductors of the plurality of flexible printed circuit boards, the mating contacts being exposed for electrical connection; and
a flex harness comprising a plurality of flexible printed circuit boards (FPCBs), the FPCBs being electrically connected to corresponding wafers, each FPCB having a stepped mating interface with conductors along the stepped mating interface configured to be electrically connected to corresponding terminating contacts.

15. The electrical connector of claim 14, wherein the terminating contacts are both horizontally staged and vertically staged and exposed in a pocket of the dielectric body for electrical termination.

16. The electrical connector of claim 14, wherein the leadframe is a stamped and formed leadframe, the leads being stepped to vertically stagger the terminating contacts at various vertical stages.

17. The electrical connector of claim 14, wherein the dielectric body includes a first side and a second side, the terminating contacts being vertically offset at various vertical stages between the first and second sides, each vertical stage having plural terminating contacts thereon.

18. The electrical connector of claim 14, wherein the mating contacts are coplanar on a mating plane, the terminating contacts being vertically staged at various vertical stages below the mating plane.

19. The electrical connector of claim 14, wherein the dialectic body is an overmolded dielectric body overmolded over the leadframe.

\* \* \* \* \*